(12) United States Patent
Wang et al.

(10) Patent No.: US 6,924,511 B2
(45) Date of Patent: Aug. 2, 2005

(54) VERTICAL CAVITY SURFACE EMITTING SEMICONDUCTOR LASER WITH TRIANGLE PRISM OPTICAL CAVITY RESONATOR

(75) Inventors: Wang Nang Wang, Bath (GB); Yury Georgievich Shreter, St. Petersburg (RU); Yury Toomasovich Rebane, St. Petersburg (RU)

(73) Assignee: Arima Optoelectronics Corp. (TW)

( * ) Notice: Subject to any disclaimer, the term of this patent is extended or adjusted under 35 U.S.C. 154(b) by 632 days.

(21) Appl. No.: 10/038,510

(22) Filed: Jan. 3, 2002

(65) Prior Publication Data

US 2004/0217381 A1 Nov. 4, 2004

(51) Int. Cl.[7] .............................................. H01L 27/15
(52) U.S. Cl. ............................. 257/81; 257/103; 372/99
(58) Field of Search .................. 257/81, 103; 372/99, 372/100, 45

(56) References Cited

U.S. PATENT DOCUMENTS

| | | | | |
|---|---|---|---|---|
| 4,851,368 A | * | 7/1989 | Behfar-Rad et al. | 438/39 |
| 4,949,350 A | * | 8/1990 | Jewell et al. | 372/45 |
| 5,617,445 A | * | 4/1997 | Jewell | 372/96 |
| 5,656,832 A | * | 8/1997 | Ohba et al. | 257/190 |

FOREIGN PATENT DOCUMENTS

| | | |
|---|---|---|
| CN | 1267106 | 9/2000 |
| GB | 2352326 | 5/2000 |
| GB | 2350721 | 8/2000 |

* cited by examiner

*Primary Examiner*—David Nelms
*Assistant Examiner*—Tu-Tu Ho
(74) *Attorney, Agent, or Firm*—Volpe and Koenig, P.C.

(57) ABSTRACT

The invention provides a method and device for light generation wherein an embodiment of the device comprises a lower electrode, a conducting substrate formed on the lower electrode, and a triangle mesa structure having an optical cavity formed on the substrate. The triangle mesa structure (which can also be truncated) further comprises an active layer, a lower conducting mirror and an upper conducting mirror for vertical confinement of light in the optical cavity, a contact layer formed on the upper mirror, a metallic contact formed on the contact layer. An electrical current is applied to the device according to the invention through the metallic contact linked to the contact layer, and subsequently to the lower electrode through the lower mirror and the conducting substrate. The applied current results in light generation in the active layer with vertical light output through the metallic contact. A corresponding light generation method is also disclosed herein.

17 Claims, 5 Drawing Sheets

VERTICAL CAVITY SURFACE EMITTING SEMICONDUCTOR LASER WITH TRIANGLE PRISM OPTICAL CAVITY RESONATOR

BACKGROUND OF THE INVENTION

1. Field of the Invention

The invention relates to light generation devices and, more particularly, to a vertical cavity surface emitting semiconductor laser (VCSEL) with a triangle prism optical cavity resonator.

2. Description of the Related Art

Light generation devices such as semiconductor laser diodes having optical cavities for light generation are commonly known and have been implemented in numerous applications in the art. However, in prior art semiconductor laser diodes, light generation in the optical cavity leads to drawbacks such as unfavorable internal reflection conditions for lateral propagation of optical modes and lower quality factors of vertical optical cavities with higher threshold currents. There is therefore a general need in the art for a light generation device that overcomes the aforementioned drawbacks in the prior art, and more particularly, a light generation device with an optical cavity (such as a VCSEL) that can operate with favorable internal reflection conditions for lateral propagation of optical modes and optimal quality factors of light generation in vertical optical cavities.

SUMMARY OF THE INVENTION

The invention provides a method and device for light generation wherein an embodiment of the device comprises a lower electrode, a conducting substrate formed on the lower electrode, and a triangle mesa structure having an optical cavity formed on the substrate. The triangle mesa structure (which can also be a truncated triangle mesa structure) further comprises an active layer, a lower conducting mirror and an upper conducting mirror for vertical confinement of light in the optical cavity, a contact layer formed on the upper mirror, a metallic contact formed on the contact layer. An electrical current is applied to the device according to the invention through the metallic contact linked to the contact layer, and subsequently to the lower electrode through the lower mirror and the conducting substrate. The applied current results in light generation in the active layer with vertical light output through the metallic contact.

With the method and device for light generation according to the invention, drawbacks in the prior art are advantageously overcome, and more particularly, light generation with favorable internal reflection conditions for lateral propagation of optical modes and optimal quality factors of light generation in vertical optical cavities.

BRIEF DESCRIPTION OF THE DRAWINGS

The foregoing and other advantages and features of the invention will become more apparent from the detailed description of the preferred embodiments of the invention given below with reference to the accompanying drawings, not necessarily drawn to scale, in which.

DETAILED DESCRIPTION OF THE PREFERRED EMBODIMENTS

Figure 1:
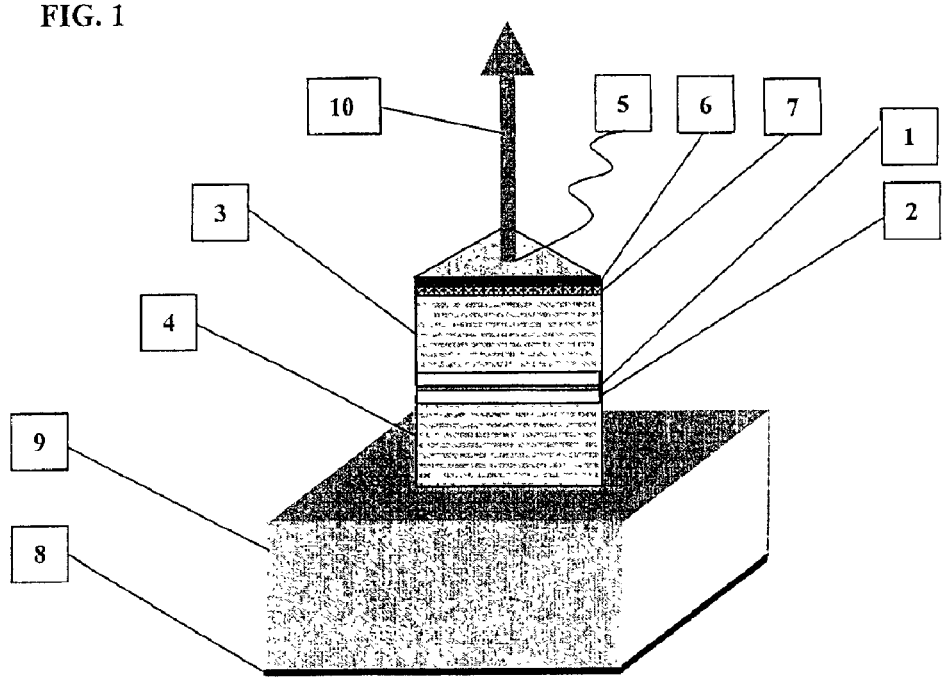
FIG. 1 is a diagram generally illustrating an embodiment of the light generation device having a triangle mesa structure according to the invention.

FIG. 1 is a diagram that generally illustrates an embodiment of the light generation device having a triangle mesa structure according to the invention, i.e., a triangle vertical cavity surface emitting semiconductor laser (or T-VCSEL). According to this general embodiment of the invention, the T-VCSEL comprises a lower electrode 8, a conducting substrate 9 and formed on the lower electrode 8, and a triangle mesa structure 5 having an optical cavity 2 formed on the substrate 9. The triangle mesa structure 5 (which can also be a truncated triangle mesa structure) further comprises an active layer 1, a lower conducting mirror 4 and an upper conducting mirror 3 for vertical confinement of light in the optical cavity 2, a contact layer 7 formed on the upper conducting mirror 3, a metallic contact 6 formed on the contact layer 7. An electrical current is applied to the T-VCSEL according to the invention through the metallic contact 6 linked to the contact layer 7, and subsequently to the lower electrode 8 through the lower mirror 4 and the conducting substrate 9. The applied current results in light generation in the active layer 1 with vertical light output in the direction 10 through the metallic contact 6. As an electrical current is applied to the metallic contact 6, light or laser is propagated through the triangle mesa structure 5, and vertically output in the direction 10, drawbacks in the prior art are advantageously overcome, and more particularly, light generation with favorable internal reflection conditions for lateral propagation of optical modes and optimal quality factors of light generation in vertical optical cavities.

The lower conducting mirror 4 can be made of, e.g., an n-type AlGaAs or InGaAsP or AlGaN semiconductor superlattice, and the upper conducting mirror 3 accordingly made of a p-type AlGaAs or InGaAsP or AlGaN semiconductor superlattice, respectively. The upper and lower conducting mirrors can also be made of layered interference mirrors, layered metal-dielectric interference mirrors, layered dielectric-dielectric interference mirrors, or any interface between two dielectric structures with different refraction indices operating as a mirror for vertical confinement of light. Furthermore, the upper and lower mirrors can be made by etching, gluing or depositing of metal or dielectric material or plastic covered by metal lateral prism.

Figure 9:
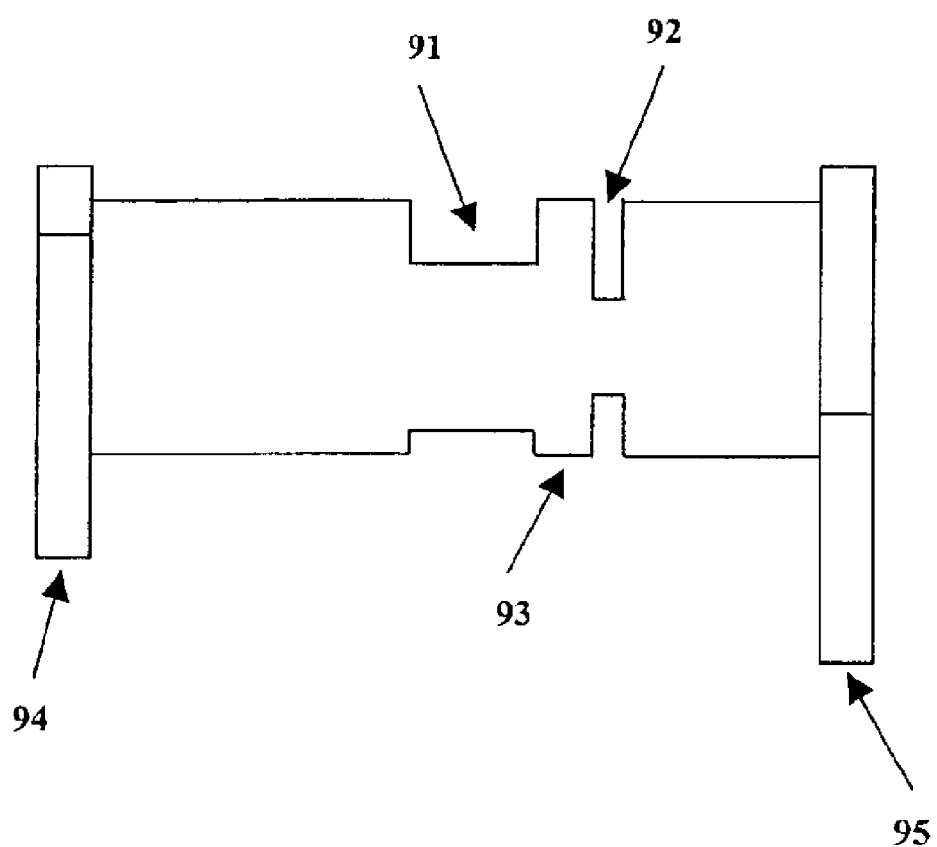
FIG. 9 is a diagram generally illustrating an exemplary active layer in the light generation device according to the invention.

The active layer 1 can be made of a group III-V or II-VI semiconductor double heterostructure, a single quantum well (SQW), a multiple quantum well (MQW) or a current asymmetric resonance tunneling structure. FIG. 9 is a diagram that generally illustrates an exemplary active layer 1, such as a current asymmetric resonance tunneling structure, used in the T-VCSEL according to the invention. The current asymmetric resonance tunneling structure comprises an n-contact 94, a p-contact 95, and two wells, namely a wide well 91 and an active quantum well 92. The two wells 91 and 92 are coupled via a resonance tunneling barrier (RTB), which is transparent for electron transfer. The wide well 91 can be a single quantum well (SQW), i.e., a singular undoped electron emitting layer, or a multiple quantum well (MQW) as well. In a particular embodiment, an n-contact layer is deposited on top of a buffer layer formed on top of a substrate such as a sapphire or n-type GaAs substrate having a metallic contact. On the n-contact layer, an electron emitting wide well is epitaxially formed of an SQW or MQW structure. An SQW can be made of an undoped electron emitting layer made of, e.g., 0.02 $\mu$m to 0.2 $\mu$m thick $(Al_xGa_{1-x})_{0.5}In_{0.5}P$ with $0.2 \leq x \leq 0.5$. An MQW can be made of, e.g., $(Al_xGa_{1-x})_{1-y}In_yP/(Al_{x1}Ga_{1-x1})_{1-y1}In_{y1}P$ that is less than 1 $\mu$m thick, with $0.5 \leq x \leq 1$, $0.4 \leq y \leq 0.6$, $0 \leq x1 \leq 0.4$ and $0 \leq y1 \leq 0.4$. The RTB is then epitaxially deposited, which is made of an undoped $(Al_xGa_{1-x})_{0.5}In_{0.5}P$ layer that is 10 Å (angstroms) to 100 Å thick, with $0.7 < x < 1$. The RTB allows resonant tunneling of the electrons from the wide well into the active quantum well, while blocking the hole tunneling from the active well into electron injection (or an electron injecting layer). A GaN layer is then deposited on top of the buffer layer to allow the current asymmetric resonance tunneling structure to be free standing after removal of the substrate by wet etching or laser ablation.

In this embodiment according to the invention as shown in FIG. 1 (which is discussed below in further detail), the substrate 9 is a conducting n-GaAs substrate with the light output by the T-VCSEL being generated with wavelength in the general region of 700 nm to 1300 nm. Furthermore, the triangle mesa structure 5 can also be a truncated triangle mesa structure. In a further variation of this particular embodiment (which is also discussed below in further detail), the substrate 9 can be a conducting n-InP substrate with the light output by the light generation device being generated with wavelength $\lambda$ in the general region of 1300 nm to 1550 nm. According to an additional variation of this particular embodiment (which is also discussed below in further detail), the substrate 9 can be a conducting n-GaAs substrate with the light output by the T-VCSEL being generated with wavelength in the general region of 1300 nm.

According to this particular embodiment according to the invention where the substrate 9 is a conducting n-GaAs substrate and the light output by the T-VCSEL is generated with wavelength in the general region of 700 nm to 1300 nm, the triangle mesa structure 5 comprises a high-index GaAs optical cavity 2 having an active layer 1 made of InGaAs/GaAlAs double heterostructure, InGaAs/GaAlAs single quantum well, InGaAs/GaAlAs multiple quantum wells or a current asymmetric resonance tunnelling structure. Furthermore, the lower conducting mirror 4 is made of an n-type AlGaAs superlattice, whereas the upper conducting mirror 3 is made of a p-type AlGaAs superlattice. The contact layer 7 is made of a p-type AlGaAs layer with a semitransparent metallic contact 6.

According to a further variation of this particular embodiment according to the invention where the substrate 9 is a conducting n-InP substrate and the light output by the T-VCSEL is generated with wavelength in the general region of 1300 nm to 1550 nm, the triangle mesa structure 5 comprises a high-index InGaAsP or AlGaAsSb optical cavity 2 having an active layer 1 made of InGaAsP/InGaAsP double heterostructure, InGaAsP/InGaAsP single quantum well, InGaAsP/InGaAsP multiple quantum wells, or a current asymmetric resonance tunnelling structure. Furthermore, the lower conducting mirror 4 is made of an n-type InGaAsP/InGaAsP or AlGaPSb/AlGaPSb superlattice, whereas the upper conducting mirror 3 is made of a p-type InGaAsP/InGaAsP or AlGaPSb/AlGaPSb superlattice. The contact layer 7 is made of a p-type InP cladding layer with a semitransparent metallic contact 6.

According to an additional variation of this particular embodiment according to the invention where the substrate 9 is a conducting n-GaAs substrate and the light output by the T-VCSEL is generated with wavelength in the general region of 1300 nm, the triangle mesa structure 5 comprises a high-index GaAs optical cavity 2 having an active layer 1 made of GaAsSb/GaAlAs double heterostructure, InGaAsN/GaAlAs double heterostructure, GaAsSb/GaAlAs single quantum well, InGaAsN/GaAlAs single quantum well, GaAsSb/GaAlAs multiple quantum wells, or InGaAsN/GaAlAs multiple quantum wells, or a current asymmetric resonance tunnelling structure. The lower conducting mirror 4 is made of an n-type AlGaAs superlattice, whereas the upper conducting mirror 3 is made of a p-type AlGaAs superlattice. The contact layer 7 is a p-type AlGaAs layer with a semitransparent metallic contact 6.

Figure 2:
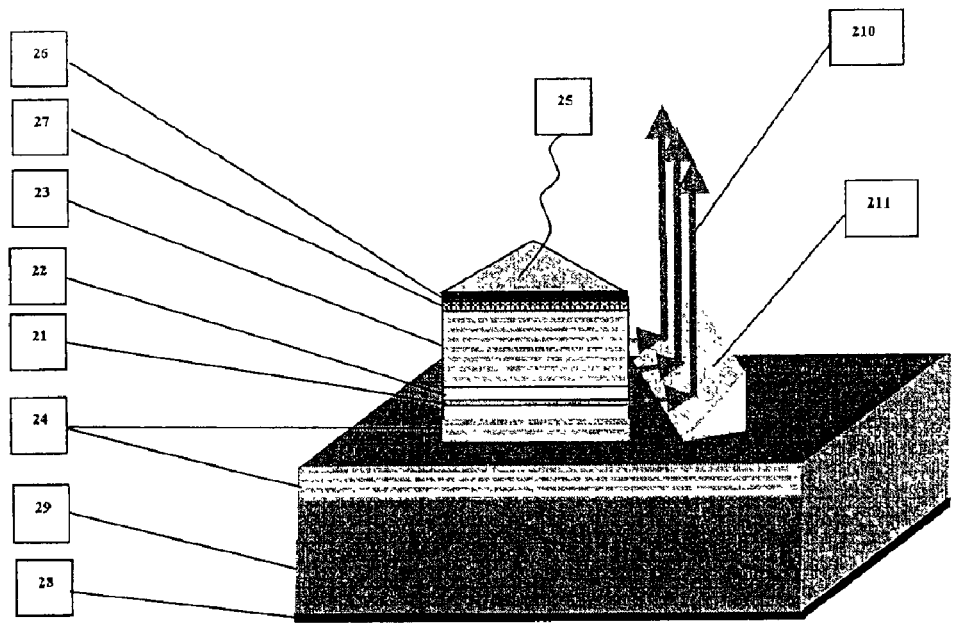
FIG. 2 is a diagram illustrating a further embodiment of the light generation device having a triangle mesa structure with a mirror sidewall reflector according to the invention.

FIG. 2 is a diagram that illustrates a further embodiment of the T-VCSEL with a mirror sidewall reflector 211 according to the invention. According to this particular embodiment of the invention, the T-VCSEL comprises a lower electrode 28, a conducting substrate 29 and formed on the lower electrode 28, and a triangle mesa structure 25 having an optical cavity 22 formed on the substrate 29. The triangle mesa structure 25 (which can also be a truncated triangle mesa structure) further comprises an active layer 21, a lower conducting mirror 24 and an upper conducting mirror 23 for vertical confinement of light in the optical cavity 22, a contact layer 27 formed on the upper conducting mirror 23, a metallic contact 26 formed on the contact layer 27. This particular embodiment is similar in structure to the embodiment shown in FIG. 1, except that a mirror sidewall reflector 211 is placed on the substrate 29 for deflecting the light generated from the active layer 21 and outputting the light in the direction 210. As light or laser is applied to the T-VCSEL, the light is propagated through the active layer 21 and out to the mirror sidewall reflector 211 that deflects and outputs the light in the vertical direction 210.

Figure 3:
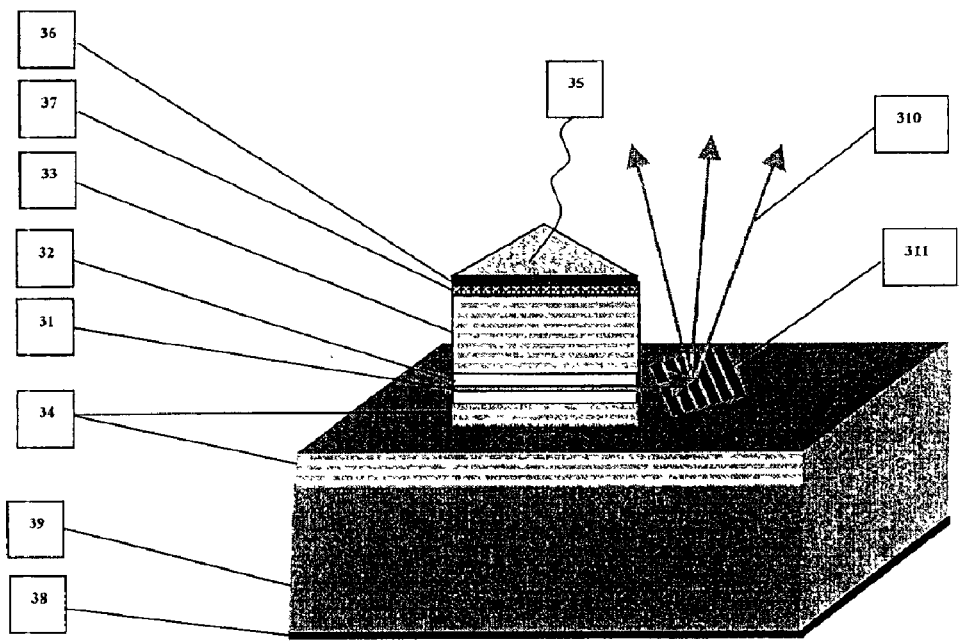
FIG. 3 is a diagram illustrating an additional embodiment of the light generation device having a triangle mesa structure and a sidewall reflector with an optical grating according to the invention.

FIG. 3 is a diagram that illustrates an additional embodiment of the T-VCSEL with a sidewall reflector 311 with optical grating according to the invention. According to this particular embodiment of the invention, the T-VCSEL comprises a lower electrode 38, a conducting substrate 39 and formed on the lower electrode 38, and a triangle mesa structure 35 having an optical cavity 32 formed on the substrate 39. The triangle mesa structure 35 (which can also be a truncated triangle mesa structure) further comprises an active layer 31, a lower conducting mirror 34 and an upper conducting mirror 33 for vertical confinement of light in the optical cavity 32, a contact layer 37 formed on the upper conducting mirror 33, a metallic contact 36 formed on the contact layer 37. This particular embodiment is similar in structure to the embodiment shown in FIG. 1, except that a sidewall reflector 311 with optical grating is placed on the substrate 39 for deflecting the light generated from the active layer 31 and outputting the light in output angles (including the output angle 310) as divided or separated by the optical grating with respect to optical modes. As light or laser is applied to the T-VCSEL, the light is propagated through the active layer 31 and out to the sidewall reflector 311 that deflects and outputs the light in output angles (including the output angle 310) as divided or separated by the optical grating with respect to optical modes.

Figure 4:
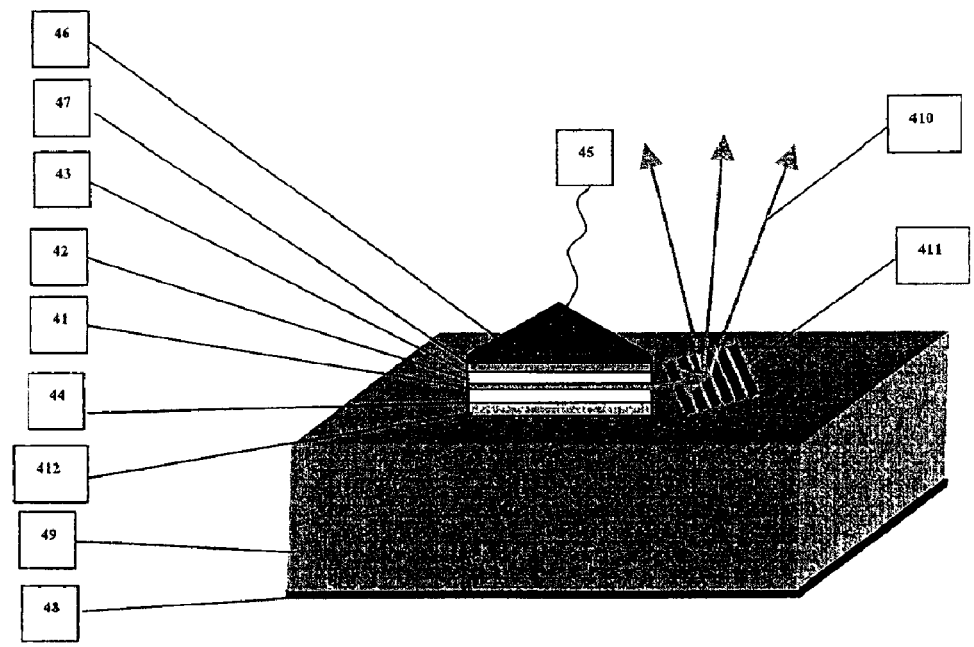
FIG. 4 is a diagram illustrating another embodiment of the light generation device having a triangle mesa structure according to the invention.

FIG. 4 is a diagram that illustrates another embodiment of the triangle vertical cavity surface emitting semiconductor laser (or T-VCSEL) according to the invention. According to this particular embodiment of the invention, the T-VCSEL comprises a lower electrode 48, a conducting substrate 49 and formed on the lower electrode 48, and a triangle mesa structure 45 having an optical cavity 42 formed on the substrate 49. The triangle mesa structure 45 (which can also be a truncated triangle mesa structure) further comprises an active layer 41, a lower conducting mirror 44 and an upper conducting mirror 43 for vertical confinement of light in the optical cavity 42, a cladding layer 412, a contact layer 47 formed on the upper mirror 43, a metallic contact 46 formed on the contact layer 47. The lower conducting mirror 44 serves as an interface between the optical cavity 42 and the cladding layer 412. The upper conducting mirror 43 serves as an interface between the optical cavity 42 and the contact layer 47. The active layer 41 can be made of a group III-V or II-VI semiconductor double heterostructure, a single quantum well (SQW), a multiple quantum well (MQW) or a current asymmetric resonance tunneling structure, as discussed herein and above. An electrical current is applied to the T-VCSEL according to the invention through the metallic contact 46 linked to the contact layer 47, and subsequently to the lower electrode 48 through the lower mirror 44 (linked to the cladding layer 412) and the conducting substrate 49. The applied current results in light generation in the active layer 41 with vertical light output in the direction 410 through the metallic contact 46. The light is propagated through the active layer 41 and out laterally to the sidewall reflector 411 that deflects and outputs the light in output angles (including the output angle 410) as divided or separated by the optical grating with respect to optical modes.

In this embodiment according to the invention (which is discussed below in further detail), the substrate 49 is a conducting n-GaAs substrate with the light output by the T-VCSEL being generated with wavelength in the general region of 700 nm to 1000 nm. Furthermore, the triangle mesa structure 45 can also be a truncated triangle mesa structure. In a further variation of this particular embodiment (which is also discussed below in further detail), the substrate 49 can be a conducting n-InP substrate with the light output by the light generation device being generated with wavelength $\lambda$ in the general region of 1300 nm to 1550 nm. According to an additional variation of this particular embodiment (which is also discussed below in further detail), the substrate 49 can be a conducting n-GaAs substrate with the light output by the T-VCSEL being generated with wavelength in the general region of 1300 nm.

According to this particular embodiment according to the invention where the substrate 49 is a conducting n-GaAs substrate and the light output by the T-VCSEL is generated with wavelength in the general region of 700 nm to 1000 nm, the triangle mesa structure 45 comprises a high-index AlGaAs optical cavity 42 having an active layer 41 made of InGaAs/GaAlAs double heterostructure, InGaAs/GaAlAs single quantum well, InGaAs/GaAlAs multiple quantum wells or a current asymmetric resonance tunnelling structure. Furthermore, the cladding layer 412 is made of an n-type AlGaAs cladding layer. The contact layer 47 is made of a p-type AlGaAs layer with a metallic contact 46.

According to a further variation of this particular embodiment according to the invention where the substrate 49 is a conducting n-InP substrate and the light output by the T-VCSEL is generated with wavelength in the general region of 1300 nm to 1550 nm, the triangle mesa structure 45 comprises a high-index InGaAsP or AlGaAsSb optical cavity 42 having an active layer 41 made of InGaAsP/InGaAsP double heterostructure, InGaAsP/InGaAsP single quantum well, InGaAsP/InGaAsP multiple quantum wells, or a current asymmetric resonance tunnelling structure. Furthermore, the cladding layer 412 is made of an n-type AlGaInP cladding layer. The contact layer 47 is made of a p-type AlGaInP cladding layer with a metallic contact 46.

According to an additional variation of this particular embodiment according to the invention where the substrate 49 is a conducting n-GaAs substrate and the light output by the T-VCSEL is generated with wavelength in the general region of 1300 nm, the triangle mesa structure 45 comprises a high-index AlGaAs optical cavity 42 having an active layer 41 made of GaAsSb/GaAlAs double heterostructure, InGaAsN/GaAlAs double heterostructure, GaAsSb/GaAlAs single quantum well, InGaAsN/GaAlAs single quantum well, GaAsSb/GaAlAs multiple quantum wells, or InGaAsN/GaAlAs multiple quantum wells, or a current asymmetric resonance tunnelling structure. Furthermore, the cladding layer 412 is made of an n-type AlGaAs cladding layer. The contact layer 47 is a p-type AlGaAs layer with a metallic contact 46.

Figure 5:
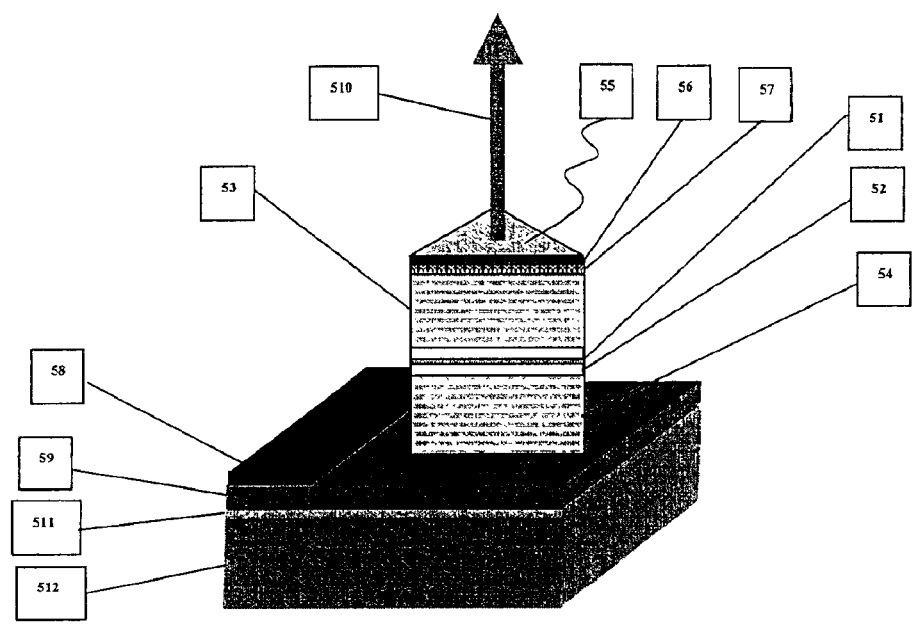
FIG. 5 is a diagram illustrating yet another embodiment of the light generation device having a triangle mesa structure according to the invention.
Figure 6:
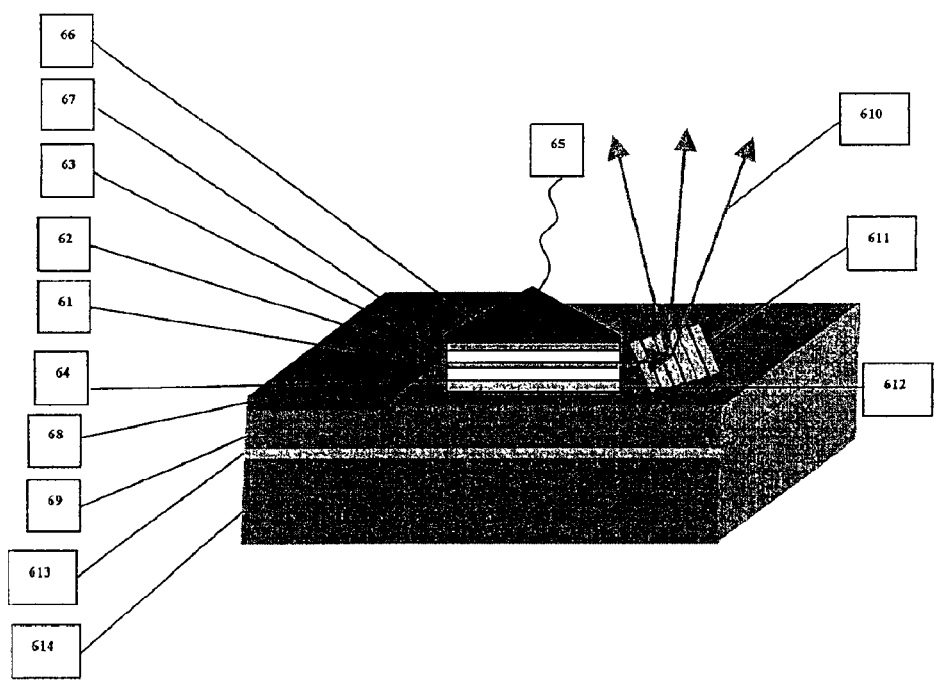
FIG. 6 is a diagram illustrating yet another embodiment of the light generation device having a triangle mesa structure according to the invention.
Figure 7:
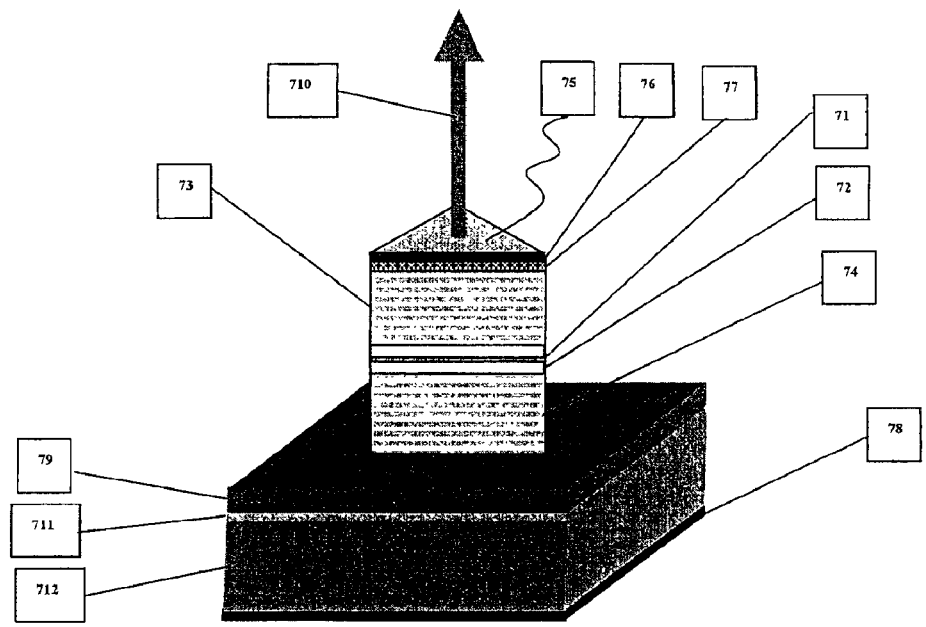
FIG. 7 is a diagram illustrating yet another embodiment of the light generation device having a triangle mesa structure according to the invention.

FIG. 5 is a diagram that illustrates yet another embodiment of the triangle vertical cavity surface emitting semiconductor laser (or T-VCSEL) according to the invention. The T-VCSEL shown in FIGS. 6 and 7 is generally the same in structure, with minor exceptions in the manner by which light is output (e.g., a sidewall reflector 611 having an optical grating in FIG. 6 that deflects and outputs the light in output angles (including the output angle 610) as divided or separated by the optical grating with respect to optical modes), as the T-VCSEL shown in FIG. 5 (discussed in further detail below).

According to this particular embodiment of the invention, the T-VCSEL, which operates to generate light with wavelength in the general region of 400 nm to 700 nm, comprises a lower electrode 58, a conducting n-GaN layer 59 formed on a sapphire substrate 512, a BAlGaInN buffer layer 511, a triangle or truncated triangle mesa structure 55. The triangle mesa structure 55 further comprises a high-index InGaAlN optical cavity 52 having an active layer 51, a lower conducting mirror 54 and an upper conducting mirror 53 for vertical confinement of light in the optical cavity 52, a p-type InAlGaN contact layer 57, and a semitransparent metallic contact 56. The active layer 51 can be made of InGaN/InGaAlN double heterostructure, InGaN/InGaAlN single quantum well, InGaN/InGaAlN multiple quantum wells, or a current asymmetric resonance tunnelling structure. Furthermore, the lower conducting mirror 54 is made of an n-type AlGaN superlattice, whereas the upper conducting mirror 53 is made of a p-type AlGaN superlattice. An electrical current is applied to the T-VCSEL according to the invention through the semitransparent metallic contact 56 linked to the conducting mirror 53 through the contact layer 57 and the lower electrode 58 which is linked to the lower conducting mirror 54, and through the conducting substrate 59. The applied current results in light generation in active layer 51, and vertical light output in the direction 510 through the semitransparent metallic contact 56.

According to a further variation of this particular embodiment of the invention as shown in FIG. 5, the T-VCSEL, which operates to generate light with wavelength in the general region of 400 nm to 700 nm, comprises a lower electrode 58 to a conducting n-SiC substrate 512, a BAlGaInN buffer layer 511, a conducting n-GaN layer 59, and a triangle or truncated triangle mesa structure 55. The triangle mesa structure 55 further comprises a high-index InGaAlN optical cavity 52 having an active layer 51, a lower conducting mirror 54 and an upper conducting mirror 53 for vertical confinement of light in the optical cavity 52, a p-type InAlGaN contact layer 57, and a semitransparent metallic contact 56. The active layer 51 can be made of InGaN/InGaAlN double heterostructure, InGaN/InGaAlN single quantum well, InGaN/InGaAlN multiple quantum wells or a current asymmetric resonance tunnelling structure. Furthermore, the lower conducting mirror 54 is made of an n-type AlGaN superlattice, whereas the upper conducting mirror 53 is made of a p-type AlGaN superlattice. An electrical current is applied to the T-VCSEL according to the invention through the semitransparent metallic contact 56 linked to the conducting mirror 53 through the contact layer 57 and the lower electrode 58 which is linked to the lower conducting mirror 54, and through the conducting substrate 59. The applied current results in light generation in active layer 51, and vertical light output in the direction 510 through the semitransparent metallic contact 56.

Figure 8:
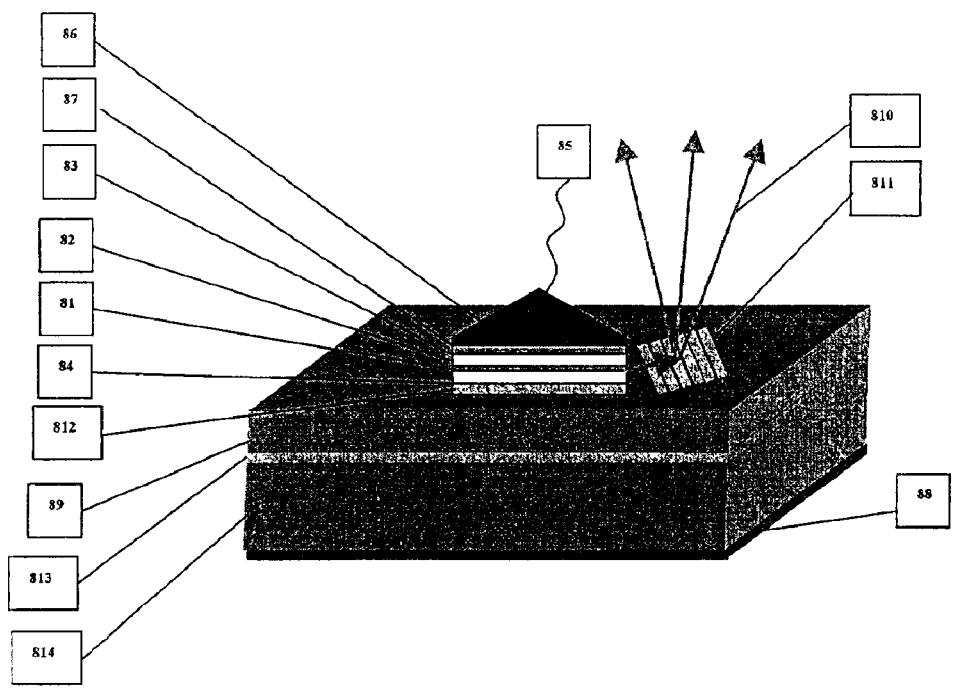
FIG. 8 is a diagram illustrating yet another embodiment of the light generation device having a triangle mesa structure according to the invention.

FIG. 8 is a diagram that illustrates yet another embodiment of the triangle vertical cavity surface emitting semiconductor laser (or T-VCSEL) according to the invention. According to this particular embodiment of the invention, the T-VCSEL, which operates to generate light with wavelength in the general region of 400 nm to 700 nm, comprises a lower electrode 88, a conducting n-GaN layer 89 formed on a sapphire substrate 814, a BAlGaInN buffer layer 813, and a triangle or truncated triangle mesa structure 85. The triangle mesa structure 85 further comprises a high-index InGaAlN optical cavity 82 having an active layer 81, an n-type AlGaN cladding layer 812, a lower conducting mirror 84 and an upper conducting mirror 83 for vertical confinement of light in the optical cavity 52, a p-type AlGaN contact layer 87, and a metallic contact 86. The active layer 81 can be made of InGaN/InGaAlN double heterostructure, InGaN/InGaAlN single quantum well, InGaN/InGaAlN multiple quantum wells, or a current asymmetric resonance tunnelling structure. The lower conducting mirror 84 serves as an interface between the optical cavity 82 and the cladding layer 812. The upper conducting mirror 83 serves as an interface between the optical cavity 82 and the contact layer 87. An electrical current is applied to the T-VCSEL according to the invention through the metallic contact 86 linked to the contact layer 87, and subsequently to the lower electrode 88 through the lower conducting mirror 84 (linked to the cladding layer 812) and the substrate 814. The applied current results in light generation in the active layer 81 with vertical light output in the direction 810 through the metallic contact 86. The light is propagated through the active layer 81 and out laterally to the sidewall reflector 811 having an optical grating that deflects and outputs the light in output angles (including the output angle 810) as divided or separated by the optical grating with respect to optical modes.

According to a further variation of this particular embodiment of the invention as shown in FIG. 8, the T-VCSEL, which operates to generate light with wavelength in the general region of 400 nm to 700 nm, comprises a lower electrode 88 to a conducting n-SiC substrate 814, a BAlGaInN buffer layer 813, a conducting n-GaN layer 59, and a triangle or truncated triangle mesa structure 85. The triangle mesa structure 85 further comprises a high-index InGaAlN optical cavity 82 having an active layer 81, an n-type AlGaN cladding layer 812, a lower conducting mirror 84 and an upper conducting mirror 83 for vertical confinement of light in the optical cavity 82, a p-type AlGaN contact layer 87, and a metallic contact 86. The active layer 81 can be made of InGaN/InGaAlN double heterostructure, InGaN/InGaAlN single quantum well, InGaN/in GaAlN multiple quantum wells or a current asymmetric resonance tunnelling structure. The lower conducting mirror 84 serves as an interface between the optical cavity 82 and the cladding layer 812. The upper conducting mirror 83 serves as an interface between the optical cavity 82 and the contact layer 87. Similarly, an electrical current is applied to the T-VCSEL according to the invention through the metallic contact 86 linked to the contact layer 87, and subsequently to the lower electrode 88 through the lower conducting mirror 84 (linked to the cladding layer 812) and the substrate 814. The applied current results in light generation in the active layer 81 with vertical light output in the direction 810 through the metallic contact 86. The light is propagated through the active layer 81 and out laterally to the sidewall reflector 811 having an optical grating that deflects and outputs the light in output angles (including the output angle 810) as divided or separated by the optical grating with respect to optical modes.

Although the invention has been particularly shown and described in detail with reference to the preferred embodiments thereof, the embodiments are not intended to be exhaustive or to limit the invention to the precise forms disclosed herein. It will be understood by those skilled in the art that many modifications in form and detail may be made without departing from the spirit and scope of the invention. Similarly, any process steps described herein may be interchangeable with other steps to achieve substantially the same result. All such modifications are intended to be encompassed within the scope of the invention, which is defined by the following claims and their equivalents.

What is claimed is:

1. A light generation device comprising:
   a conducting substrate;
   a lower electrode formed on said substrate;
   a triangle mesa structure having an optical cavity formed on said substrate for lateral light confinement wherein said mesa structure is one selected from the group consisting of a triangle and a truncated triangle mesa structure; wherein said triangle mesa structure further comprises:
   an active layer;
   a lower conducting mirror and an upper conducting mirror for vertical light confinement;
   a contact layer formed on said upper conducting mirror; and
   a metallic contact formed on said contact layer; and
   a sidewall deflector having an optical grating on said substrate.

2. The device of claim 1 wherein: said lower conducting mirror is one selected from the group consisting of an n-type AlGaAs, InGaAsP and AlGaN semiconductor superlattice; and said upper conducting mirror is one selected from the group consisting of a p-type AlGaAs, InGaAsP and AlGaN semiconductor superlattice.

3. The device of claim 1 wherein light is generated in said active layer that is vertically output through said metallic contact as a result of applying an electrical current through said metallic contact which is linked to said contact layer, said lower electrode, said lower mirror and said conducting substrate.

4. The device of claim 1 wherein said active layer is made from one selected from the group consisting of a double heterostructure, a single quantum well (SQW), a multiple quantum well (MQW) and a current asymmetric resonance tunneling structure.

5. The device of claim 1 wherein: said substrate is a conducting n-GaAs substrate; said optical cavity is a GaAs optical cavity; said active layer is one selected from the group consisting of InGaAs/GaAlAs double heterostructure, InGaAs/GaAlAs single quantum well, InGaAs/GaAlAs multiple quantum wells, and a current asymmetric resonance tunnelling structure; said lower conducting mirror is made of an n-type AlGaAs superlattice; said upper conducting mirror is made of a p-type AlGaAs superlattice; and said upper contact layer is made of a p-type AlGaAs layer; wherein said metallic contact is semitransparent.

6. The device of claim 1 wherein: said substrate is a conducting n-InP substrate; said optical cavity is one selected from said group consisting of an InGaAsP optical cavity and an AlGaAsSb optical cavity; said active layer is one selected from the group consisting of InGaAsP/InGaAsP double heterostructure, InGaAsP/InGaAsP single quantum well, InGaAsP/InGaAsP multiple quantum wells, and a current asymmetric resonance tunnelling structure; said lower conducting mirror is one selected from the group consisting of an n-type InGaAsP/InGaAsP superlattice and an n-type AlGaPSb/AlGaPSb superlattice; said upper conducting mirror is one selected from the group consisting of a p-type InGaAsP/InGaAsP superlattice and a p-type AlGaPSb/AlGaPSb superlattice; and said upper contact layer is made of a p-type InP cladding layer; wherein said metallic contact is semitransparent.

7. The device of claim 1 wherein: said substrate is a conducting n-GaAs substrate; said optical cavity is a GaAs optical cavity; said active layer is one selected from the group consisting of a GaAsSb/GaAlAs double heterostructure, InGaAsN/GaAlAs double heterostructure, GaAsSb/GaAlAs single quantum well, InGaAsN/GaAlAs single quantum well, GaAsSb/GaAlAs multiple quantum wells, InGaAsN/GaAlAs multiple quantum wells, and a current asymmetric resonance tunnelling structure; said lower conducting mirror is made of an n-type AlGaAs superlattice; said upper conducting mirror is made of a p-type AlGaAs superlattice; and said upper contact layer is made of a p-type AlGaAs layer; wherein said metallic contact is semitransparent.

8. The device of claim 1 further comprising a cladding layer wherein said lower conducting mirror serves as an interface between said optical cavity and said cladding layer, and said upper conducting mirror serves as an interface between said optical cavity and said contact layer.

9. The device of claim 8 wherein said cladding layer is one selected from the group consisting of an n-type AlGaAs layer and an n-type AlGaInP layer.

10. The device of claim 1 wherein said conducting substrate is one selected from the group consisting of n-GaAs, n-InP, n-SiC and sapphire.

11. The device of claim 1 further comprising a buffer layer made of BAlGaInN between said substrate and said triangle mesa structure.

12. The device of claim 11 further comprising a conducting n-GaN layer between said buffer layer and said triangle mesa structure.

13. The device of claim 12 wherein: said substrate is made of sapphire; said optical cavity is an InGaAlN optical cavity; said active layer is one selected from the group consisting of InGaN/InGaAlN double heterostructure, InGaN/InGaAlN single quantum well, InGaN/InGaAlN multiple quantum wells, and a current asymmetric resonance tunnelling structure; said lower conducting mirror is made of an n-type AlGaN superlattice; and said upper conducting mirror is made of a p-type AlGaN superlattice; wherein said metallic contact is semitransparent.

14. The device of claim 12 wherein: said substrate is made of a conducting n-SiC substrate; said optical cavity is an InGaAlN optical cavity; said active layer is one selected from the group consisting of InGaN/InGaAlN double heterostructure, InGaN/InGaAlN single quantum well, InGaN/InGaAlN multiple quantum wells, and a current asymmetric resonance tunnelling structure; said lower conducting mirror is made of an n-type AlGaN superlattice; and said upper conducting mirror is made of a p-type AlGaN superlattice; wherein said metallic contact is semitransparent.

15. The device of claim 1 further comprising: a buffer layer made of BAlGaInN on said substrate; a conducting n-GaN layer on said buffer layer; and a cladding layer between said conducting n-GaN layer and said triangle mesa structure; wherein said substrate is one selected from the group consisting of n-SiC and sapphire.

16. The device of claim 15 wherein: said optical cavity is an InGaAlN optical cavity; and said active layer is one selected from the group consisting of InGaN/InGaAlN double heterostructure, InGaN/InGaAlN single quantum well, InGaN/InGaAlN multiple quantum wells, and a current asymmetric resonance tunnelling structure; wherein said lower conducting mirror serves as an interface between said optical cavity and said cladding layer, and said upper conducting mirror serves as an interface between said optical cavity and said contact layer.

17. A light generation device comprising:
   a conducting substrate;
   a lower electrode formed on said substrate;
   a triangle mesa structure having an optical cavity formed on said substrate for lateral light confinement wherein said mesa structure is one selected from the group consisting of a triangle and a truncated triangle mesa structure; wherein said triangle mesa structure further comprises:
      an active layer;
      a lower conducting mirror and an upper conducting mirror for vertical light confinement;
      a contact layer formed on said upper conducting mirror; and
      a metallic contact formed on said contact layer; and
   a mirror sidewall deflector formed in or on said lower conducting mirror.

* * * * *